(12) United States Patent
Kim et al.

(10) Patent No.: US 7,785,992 B2
(45) Date of Patent: Aug. 31, 2010

(54) ARRAY SUBSTRATE FOR FLAT DISPLAY DEVICE AND METHOD FOR FABRICATING THE SAME

(75) Inventors: Sung Ki Kim, Seoul (KR); Hong Koo Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/314,510

(22) Filed: Dec. 11, 2008

(65) Prior Publication Data
US 2009/0321739 A1 Dec. 31, 2009

(30) Foreign Application Priority Data
Jun. 25, 2008 (KR) .................. 10-2008-0060215

(51) Int. Cl.
*H01L 21/20* (2006.01)
(52) U.S. Cl. .................. 438/487; 438/149; 438/151; 438/482; 257/E33.004
(58) Field of Classification Search .................. 438/149, 438/151, 482, 487
See application file for complete search history.

(56) References Cited

U.S. PATENT DOCUMENTS 6,060,392 A * 5/2000 Essaian et al. .............. 438/682
6,335,232 B1 * 1/2002 Ohori et al. .................. 438/158
2010/0044709 A1 * 2/2010 Nakayama et al. ............ 257/59

* cited by examiner

*Primary Examiner*—Wai-Sing Louie
(74) *Attorney, Agent, or Firm*—Morgan, Lewis & Bockius LLP

(57) ABSTRACT

The present invention relates to an array substrate for a flat display device and a method for fabricating the same, in which a number of masks is reduced for reducing a cost and improving a device performance. The array substrate includes a gate electrode formed on an insulating substrate, a gate insulating film formed on an entire surface of the insulating substrate including the gate electrode, an active layer formed on the gate insulating film opposite to the gate electrode having a stack of a polysilicon layer and an amorphous silicon layer each having a width greater than the gate electrode, a source electrode and a drain electrode separated from each other at a portion of the active layer and formed over the active layer with an ohmic contact layer disposed therebetween, an interlayer insulating film formed on an entire surface of the insulating substrate having a contact hole to expose a predetermined portion of the drain electrode, and a pixel electrode connected to the drain electrode through the contact hole.

14 Claims, 10 Drawing Sheets

ARRAY SUBSTRATE FOR FLAT DISPLAY DEVICE AND METHOD FOR FABRICATING THE SAME

This application claims the benefit of the Patent Korean Application No. 10-2008-0060215, filed on Jun. 25, 2008, which is hereby incorporated by reference as if fully set forth herein.

BACKGROUND OF THE INVENTION

1. Field of the Invention

The present invention relates to an array substrate for a flat display device and a method for fabricating the same, more particularly, to an array substrate for a flat display device and a method for fabricating the same which can improve a performance and reliability.

2. Discussion of the Related Art

Following development of information oriented society, demands on display devices have been increased in variety of forms. In response to this, recently, various flat display devices have been studied, such as LCD (Liquid Crystal Display Device), PDP (Plasma Display Panel), ELD (Electro-Luminescent Display), VFD (Vacuum Fluorescent Display), and so on, some of which are utilized as display devices for various instruments, already.

Of above display devices, presently, the LCD is mostly used as mobile image display devices, while replacing the CRT (Cathode Ray Tube), owing to features and advantages of a good picture quality, light weight, thin, and low power consumption, and besides the use as the mobile image display devices, such as monitors of notebook computers, developing in variety of forms, such as TV sets which receive and display broadcasting signals, and monitors for computers.

A related art method for fabricating an array substrate for a flat display device will be described with reference to the attached drawings.

FIGS. 1A to 1F illustrate sections showing the steps of a related method for fabricating an array substrate for a flat display device.

Referring to FIG. 1A, a metal is deposited on a transparent insulating substrate 11, and subjected to photo and etching processes with a first mask to remove the metal selectively, to form a first gate electrode 12.

Then, a metal is deposited on an entire surface of the insulating substrate 11 including the first gate electrode 12, and subjected to photo and etching processes with a second mask to remove the metal selectively, to form a second gate electrode 13 on the first gate electrode 12 having a width greater than the first gate electrode 12.

Referring to FIG. 1B, a gate insulating film 14 is formed on an entire surface of the insulating substrate including the second gate electrode 13.

Then, an amorphous silicon layer is formed on the gate insulating film 14, and crystallized into a polysilicon layer.

Then, the polysilicon layer is subjected to photo and etching processes with a third mask to pattern the polysilicon layer selectively, to form an active layer 15 on the gate insulating film 14 over the first and second gate electrodes 12 and 13.

Referring to FIG. 1C, an etch stopper layer 16 is formed on an entire surface of the insulating substrate 11 including the active layer 15, and subjected to photo and etching processes with a fourth mask to pattern the etch stopper layer 16 to leave a predetermined portion of the etch stopper layer 16 on the active layer 15. In this instance, the etch stopper layer 16 is patterned such that the etch stopper layer 16 has an area smaller than the second gate electrode 13.

In this instance, the etch stopper layer 16 is formed for preventing the underlying active layer 15 from being etched at the time source/drain electrodes are formed.

Referring to FIG. 1D, an $n^+$ doped amorphous silicon layer 17 is formed on an entire surface of the insulating substrate 11 including the etch stopper layer 16.

Then, a metal is deposited on the amorphous silicon layer 17, and subjected to photo and etching processes with a fifth mask to remove the metal selectively, to form a source electrode 18a and a drain electrode 18b.

Then, the amorphous silicon layer 17 exposed by the source electrode 18a and the drain electrode 18b is removed selectively. In this instance, the source electrode 18a and the drain electrode 18b are formed spaced a predetermined distance from each other for forming a channel later.

Referring to FIG. 1E, a planarizing layer 19 is formed on an entire surface of the insulating substrate 11 including the source electrode 18a and the drain electrode 18b, and subjected to photo and etching processes with a sixth mask to remove the planarizing layer 19 selectively to expose a predetermined portion of a surface of the drain electrode 18b, to form a contact hole 20 therein.

Referring to FIG. 1F, ITO is deposited on an entire surface of the insulating substrate 11 including the contact hole 20, and subjected to photo and etching processes with a seventh mask to remove the ITO selectively to form a pixel electrode 21 connected to the drain electrode 18b, electrically.

However, the related art method for fabricating an array substrate for a flat display device has the following problems.

The use of structures of the etch stopper layer and the double gates causes to increase a number of masking processes, which increases a cost.

SUMMARY OF THE INVENTION

Accordingly, the present invention is directed to an array substrate for a flat display device and a method for fabricating the same.

An object of the present invention is to provide an array substrate for a flat display device and a method for fabricating the same, in which a number of masks is reduced for reducing a cost and improving a performance of the device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an array substrate for a display device includes a gate electrode formed on an insulating substrate, a gate insulating film formed on an entire surface of the insulating substrate including the gate electrode, an active layer formed on the gate insulating film opposite to the gate electrode having a stack of a polysilicon layer and an amorphous silicon layer each having a width greater than the gate electrode, a source electrode and a drain electrode separated from each other at a portion of the active layer and formed over the active layer with an ohmic contact layer disposed therebetween, an interlayer insulating film formed on an entire surface of the insulating substrate having a contact hole to expose a predetermined portion of the drain electrode, and a pixel electrode connected to the drain electrode through the contact hole.

In another aspect of the present invention, a method for forming an array substrate for a display device includes the steps of forming a gate electrode on an insulating substrate, forming a gate insulating film on an entire surface of the insulating substrate including the gate electrode, forming an amorphous silicon layer and a refractory metal layer on the gate insulating film in succession, directing a laser beam to an entire surface of the refractory metal layer to crystallize the amorphous silicon layer into a polysilicon layer, removing the refractory metal layer and forming an ohmic contact layer and a metal film in succession, forming a source electrode, a drain electrode, and an active layer by removing the metal film, the ohmic contact layer, and the polysilicon layer selectively at the same time, forming an interlayer insulating film on an entire surface of the insulating substrate, removing the interlayer insulating film selectively to expose a predetermined portion of the surface of the drain electrode, to form a contact hole, and forming a pixel electrode electrically connected to the drain electrode through the contact hole.

In another aspect of the present invention, a method for forming an array substrate for a display device includes the steps of forming a gate electrode on an insulating substrate, forming a gate insulating film on an entire surface of the insulating substrate including the gate electrode, forming a first amorphous silicon layer and a refractory metal layer on the gate insulating film in succession, directing a laser beam to an entire surface of the refractory metal layer to crystallize the first amorphous silicon layer into a polysilicon layer, removing the refractory metal layer and forming a second amorphous silicon layer, an ohmic contact layer and a metal film in succession, forming a source electrode, a drain electrode, and an active layer by removing the metal film, the ohmic contact layer, the polysilicon layer and the second amorphous silicon layer selectively at the same time, forming an interlayer insulating film on an entire surface of the insulating substrate, removing the interlayer insulating film selectively to expose a predetermined portion of the surface of the drain electrode, to form a contact hole, and forming a pixel electrode electrically connected to the drain electrode through the contact hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2H illustrate sections showing the steps of a method for fabricating an array substrate for a flat display device in accordance with a first preferred embodiment of the present invention.

Figure 1A:
FIGS. 1A to 1F illustrate sections showing the steps of a related method for fabricating an array substrate for a flat display device.
Figure 1B:
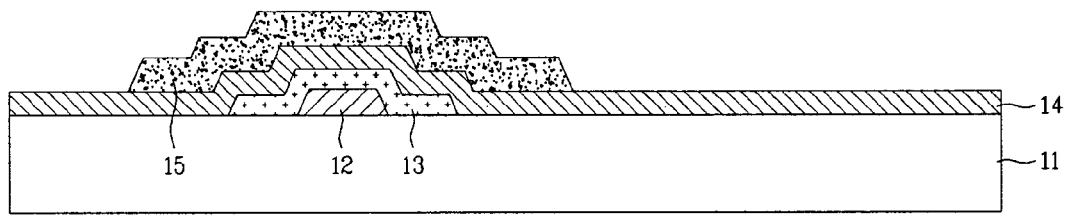
Figure 1C:
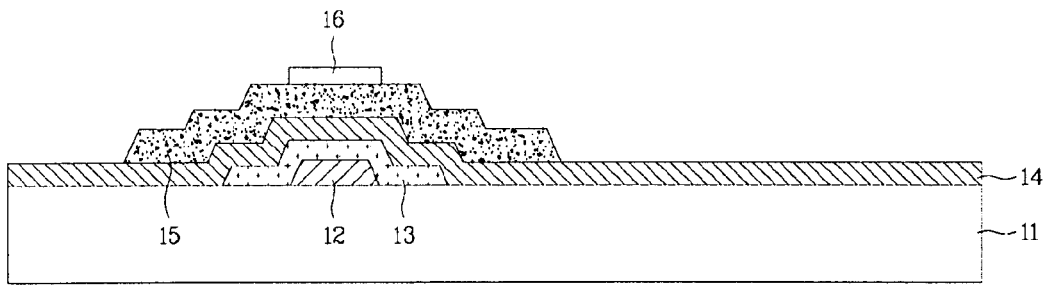
Figure 1D:
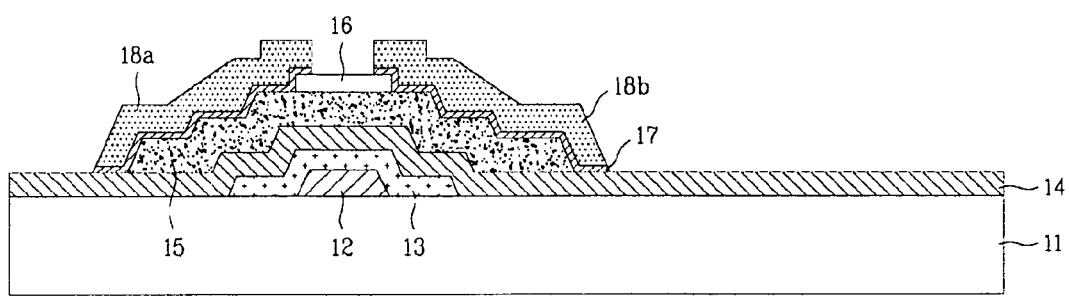
Figure 1E:
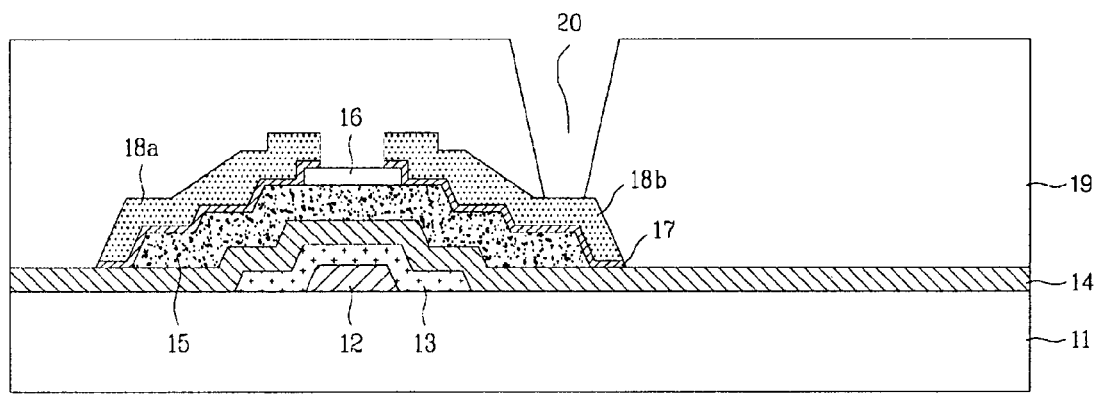
Figure 1F:
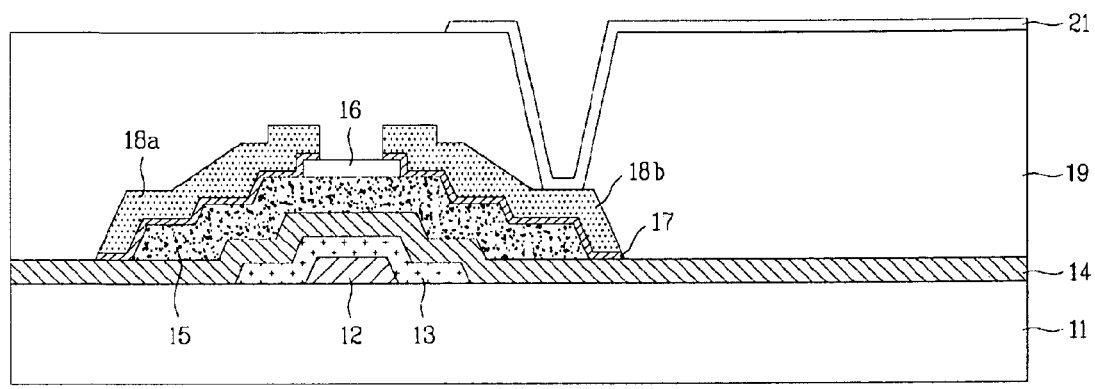
Figure 2A:
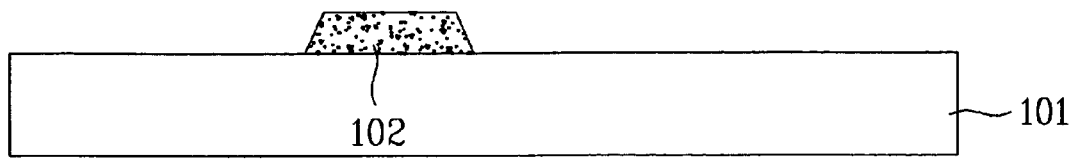
FIGS. 2A to 2H illustrate sections showing the steps of a method for fabricating an array substrate for a flat display device in accordance with a first preferred embodiment of the present invention.

Referring to FIG. 2A, a metal is deposited on a transparent insulating substrate 101, and subjected to photo and etching processes with a first mask, to remove the metal selectively, to form a gate electrode 102.

The metal may be one selected from Al, Al—Pd, Al—Si—Ti, Al—Si—Cu, and Al alloys, and sputtered to form a metal film of 200~4000 Å. That is, the gate electrode 102 may or may not be single layer.

Figure 2B:
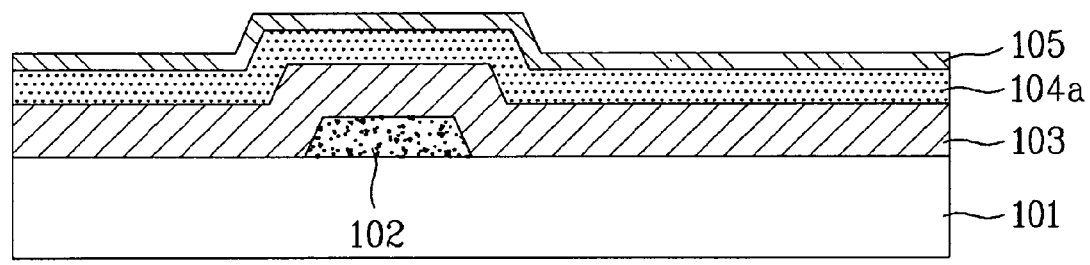

Referring to FIG. 2B, a gate insulating film 103 is formed on an entire surface of the insulating substrate 101 including the gate electrode 102, an amorphous silicon layer 104a is deposited on the gate insulating film 103, and a refractory metal layer 105 is formed on the amorphous silicon layer 104a.

The refractory metal layer 105 may be, for an example, Ti, Co, or Mo.

Figure 2C:
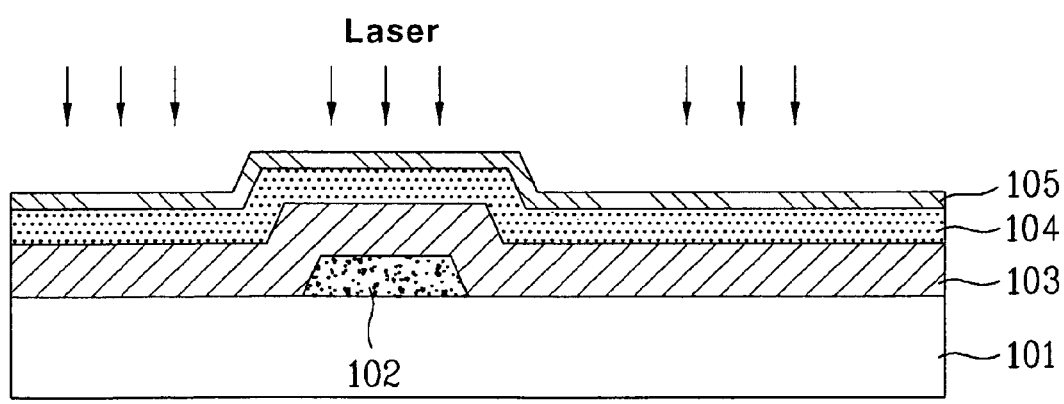

Referring to FIG. 2C, a UV laser beam IR is directed to an entire surface of the refractory metal layer 105, to crystallize the underlying amorphous silicon layer 104a into a polysilicon layer 104.

Figure 2D:
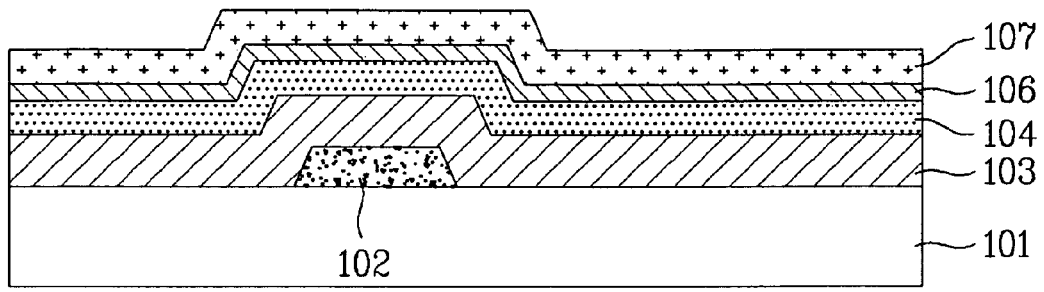

Referring to FIG. 2D, the refractory metal layer 105 on the polysilicon layer 104 is removed by wet or dry etching.

Then, an impurity doped amorphous silicon layer 106, a metal film 107 for forming a source and a drain electrodes are formed on the polysilicon layer 104, in succession.

Figure 2E:
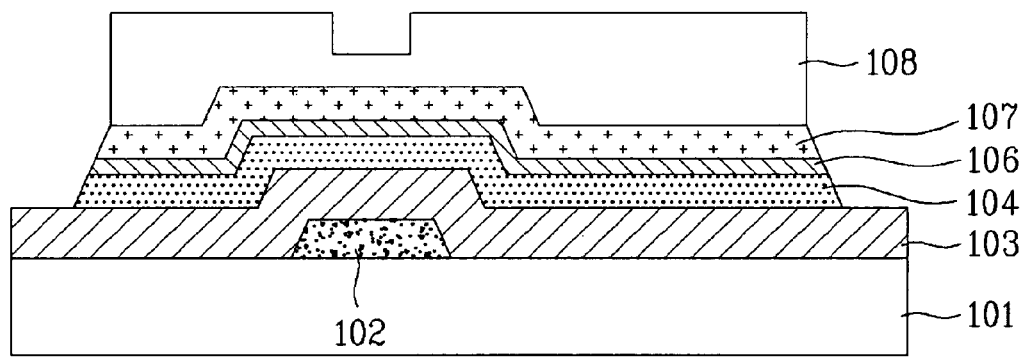

Referring to FIG. 2E, photoresist is applied to the metal film 107, and subjected to refraction, exposure and development with a second mask (half-tone mask), to form a photoresist pattern 108.

The second mask (half-tone mask) has a shielding region for shielding the light completely, a transmission region for transmission of the light, and a slit region for passing a predetermined quantity of the light.

According to this, the photoresist pattern 108 developed has different thicknesses.

Then, the metal film 107, the impurity doped amorphous silicon layer 106, and the polysilicon layer 104 are subjected to wet or drying etching with the photoresist pattern 108 used as a mask, to remove the impurity doped amorphous silicon layer 106, and the polysilicon layer 104, selectively.

Figure 2F:
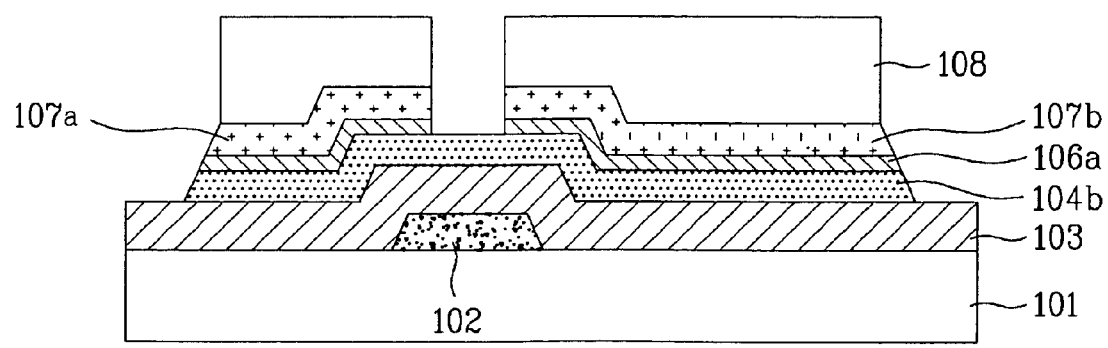

Referring to FIG. 2F, the photoresist pattern 108 is subjected to $O_2$ ashing, to remove a relatively thin portion of the photoresist pattern 108. In this instance, the photoresist pattern 108 becomes thinner in overall.

Then, the metal film 107 which corresponds to a channel region of a thin film transistor, the impurity doped amorphous silicon layer 106, and the polysilicon layer 104 are subjected to selective etching with the photoresist pattern 108 ashed thus used as a mask, to form a source electrode 107a, a drain electrode 107b, an ohmic contact layer 106a, and an active layer 104b. In this instance, the impurity doped amorphous silicon layer 106 between the source electrode 107a and the drain electrode 107b is removed, to separate the impurity doped amorphous silicon layer 106.

Figure 2G:
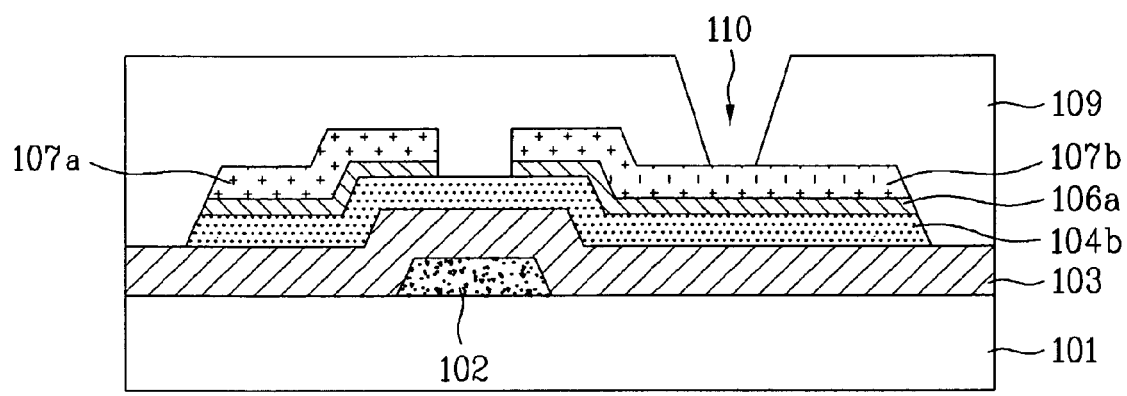

Referring to FIG. 2G, the photoresist pattern 108 is removed, an interlayer insulating film 109 is formed on an entire surface of the insulating substrate 101 including the source electrode 107a and the drain electrode 107b, and subjected to photo and etching processes with a third mask to remove the interlayer insulating film 109 selectively to expose a predetermined portion of a surface of the drain electrode 107b and form a contact hole 110.

The interlayer insulating film 110 is formed of an inorganic insulating material, such as silicon nitride or silicon oxide, or an organic insulating material having a low dielectric constant, such as an acryl group organic compound, Teflon, BCB, cytop, or PFCB.

Figure 2H:
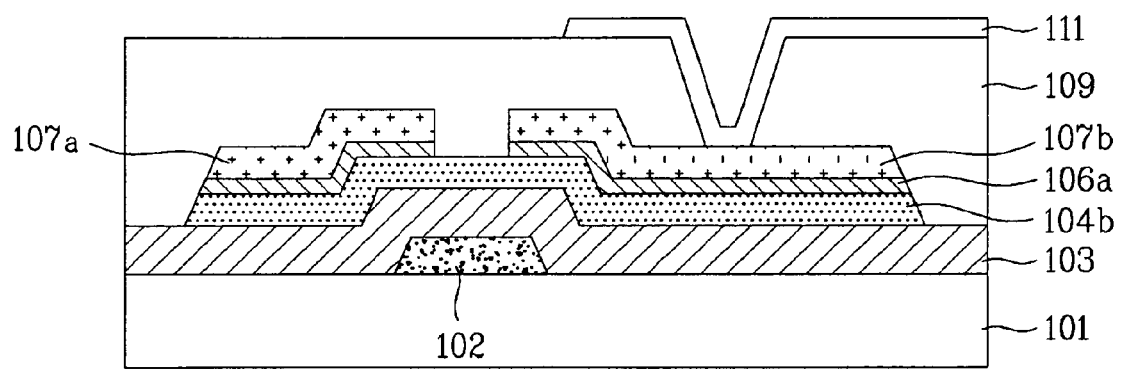

Referring to FIG. 2H, a transparent metal film is deposited on an entire surface of the insulating substrate 101 including the contact hole 110, and subjected to photo and etching processes with a fourth mask to remove the transparent metal film selectively, to form a pixel electrode 111 electrically connected to the drain electrode 107b through the contact hole 110.

Figure 3:
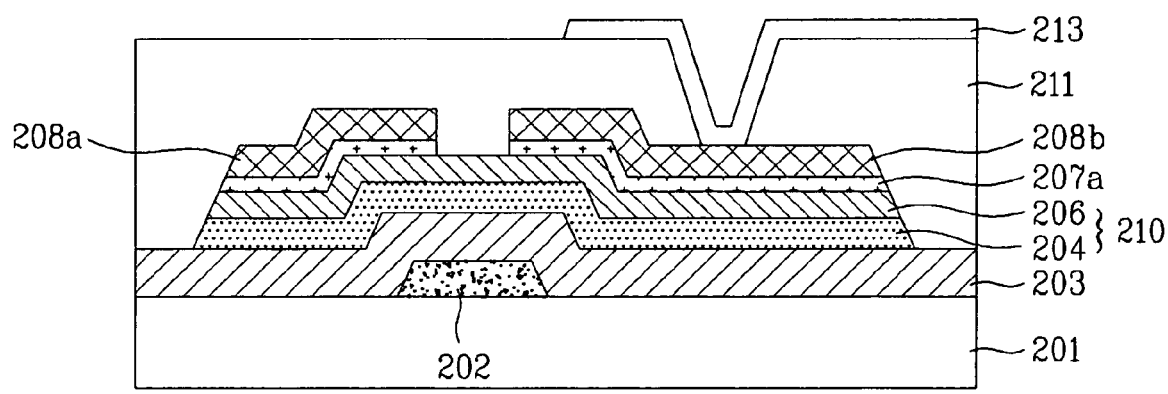
FIG. 3 illustrates a section of an array substrate for a flat display device in accordance with a preferred embodiment of the present invention.

FIG. 3 illustrates a section of an array substrate for a flat display device in accordance with a preferred embodiment of the present invention.

Referring to FIG. 3, the array substrate for a flat display device includes a gate electrode 202 formed on an insulating substrate 201, a gate insulating film 203 formed on an entire surface of the insulating substrate 201 including the gate electrode 202, an active layer 210 formed on the gate insulating film opposite to the gate electrode having a stack of a polysilicon layer 204 and an amorphous silicon layer 206 each having a width greater than the gate electrode 202, a source electrode 208a and a drain electrode 208b separated from each other at a portion of the active layer 210 and formed over the active layer 210 with an ohmic contact layer 207a disposed therebetween, an interlayer insulating film 212 formed on an entire surface of the insulating substrate 201 having a contact hole to expose a predetermined portion of the drain electrode 208b, and a pixel electrode 213 connected to the drain electrode 208b through the contact hole.

FIGS. 4A to 4H illustrate sections showing the steps of a method for fabricating an array substrate for a flat display device in accordance with a second preferred embodiment of the present invention.

Figure 4A:
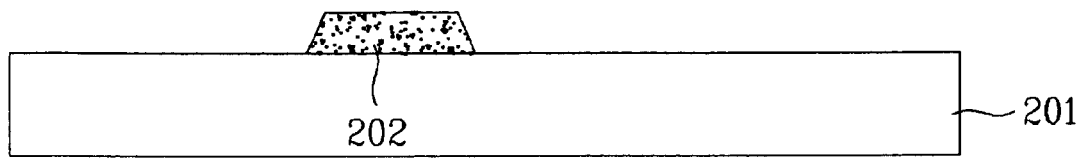
FIGS. 4A to 4H illustrate sections showing the steps of a method for fabricating an array substrate for a flat display device in accordance with a second preferred embodiment of the present invention.

Referring to FIG. 4A, a metal is deposited on a transparent insulating substrate 201, and subjected to photo and etching processes with a first mask, to remove the metal selectively, to form a gate electrode 202.

The metal may be one selected from Al, Al—Pd, Al—Si—Ti, Al—Si—Cu, and Al alloys, and sputtered to form a metal film of 200~4000 Å.

Figure 4B:
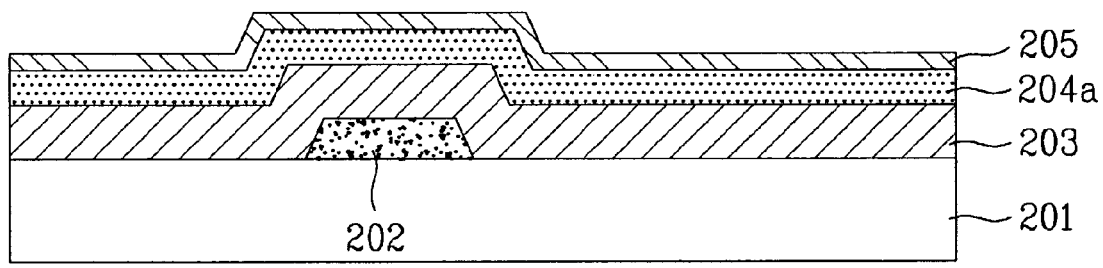

Referring to FIG. 4B, a gate insulating film 203 is formed on an entire surface of the insulating substrate 201 including the gate electrode 202, a first amorphous silicon layer 204a is deposited on the gate insulating film 203, and a refractory metal 205 is formed on the first amorphous silicon layer 204a.

The refractory metal 205 may be, for an example, Ti, Co, or Mo.

Figure 4C:
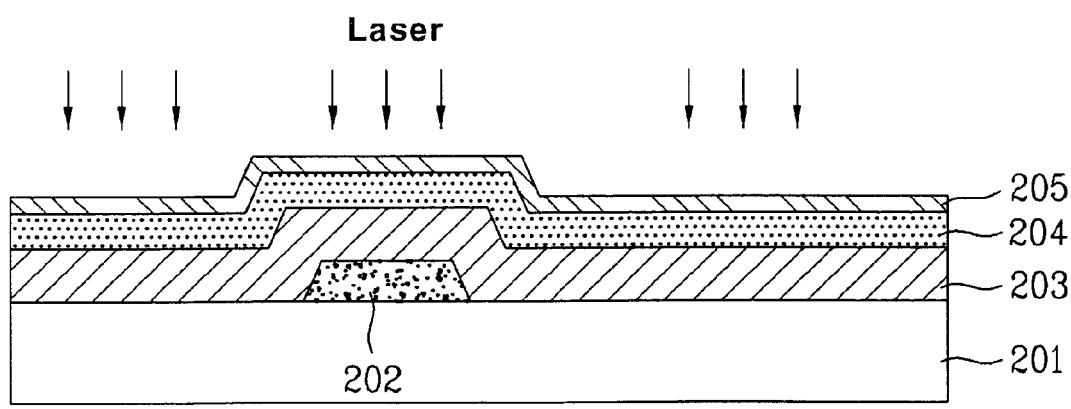

Referring to FIG. 4C, a UV laser beam IR is directed to an entire surface of the refractory metal 205, to crystallize the underlying first amorphous silicon layer 204a into a polysilicon layer 204.

Figure 4D:
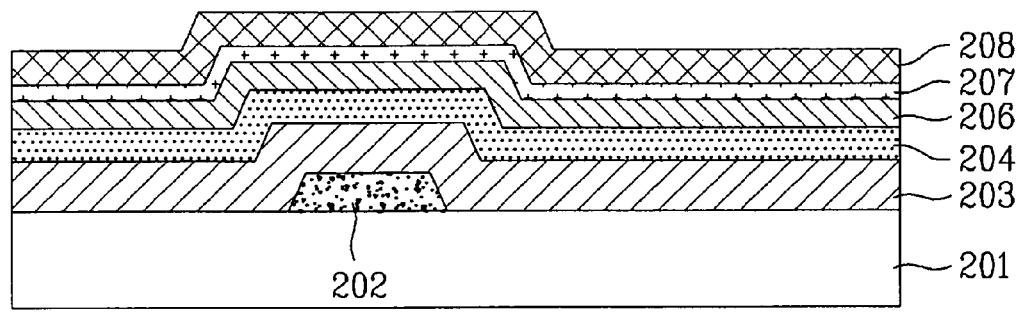

Referring to FIG. 4D, the refractory metal 205 on the polysilicon layer 204 is removed by wet or dry etching.

Though it is described that the refractory metal 205 is removed by wet or dry etching, the embodiment is not limited to this, but after a portion of the refractory metal 205 is removed by the wet etching, rest of the refractory metal 205 may be removed by dry etching, or vice versa.

Then, a second amorphous silicon layer 206, an impurity doped amorphous silicon layer 207, a metal film 208 for forming a source and a drain electrodes are formed on the polysilicon layer 204, in succession.

Figure 4E:
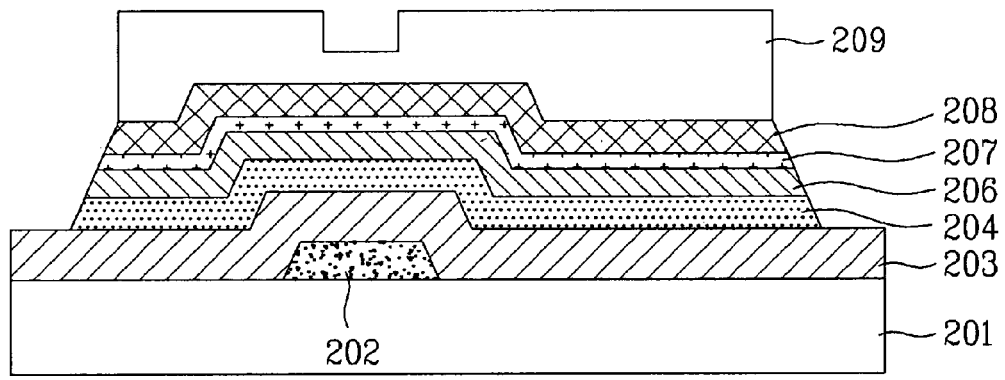

Referring to FIG. 4E, photoresist is applied to the metal film 208, and subjected to refraction, exposure and development with a second mask (half-tone mask), to form a photoresist pattern 209.

The second mask (half-tone mask) has a shielding region for shielding the light completely, a transmission region for transmission of the light, and a slit region for passing a predetermined quantity of the light.

According to this, the photoresist pattern 209 developed has different thicknesses.

Then, the metal film 208, the impurity doped amorphous silicon layer 207, the second amorphous silicon layer 206, and the polysilicon layer 204 are subjected to wet or drying etching with the photoresist pattern 209 used as a mask, to remove the impurity doped amorphous silicon layer 207, the second amorphous silicon layer 206, and the polysilicon layer 204, selectively.

Figure 4F:
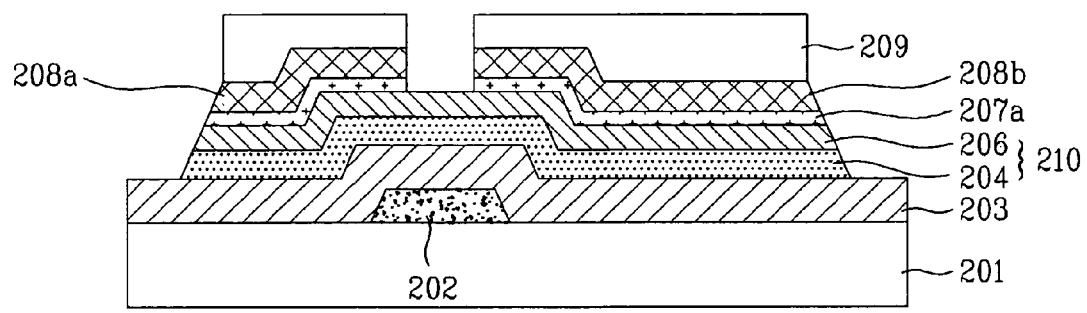

Referring to FIG. 4F, the photoresist pattern 209 is subjected to $O_2$ ashing, to remove a relatively thin portion of the photoresist pattern 209.

In this instance, the photoresist pattern 209 becomes thinner in overall.

Then, the metal film 208 which corresponds to a channel region of a thin film transistor, the impurity doped amorphous silicon layer 207, the second amorphous silicon layer 206, and the polysilicon layer 204 are subjected to selective etching with the photoresist pattern 209 ashed thus used as a mask, to form a source electrode 208a, a drain electrode 208b, an ohmic contact layer 207a, and an active layer 204b.

In this instance, the impurity doped amorphous silicon layer 207 between the source electrode 208a and the drain electrode 208b is removed, to separate the impurity doped amorphous silicon layer 207.

Figure 4G:
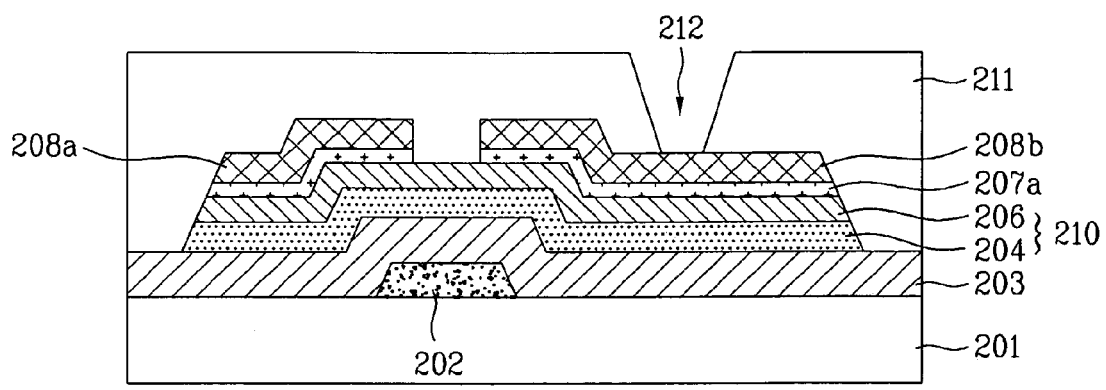

Referring to FIG. 4G, the photoresist pattern 209 is removed, an interlayer insulating film 211 is formed on an entire surface of the insulating substrate 201 including the source electrode 208a and the drain electrode 208b, and subjected to photo and etching processes with a third mask to remove the interlayer insulating film 211 selectively to expose a predetermined portion of a surface of the drain electrode 208b and form a contact hole 212.

The interlayer insulating film 212 is formed of inorganic insulating material, such as silicon nitride or silicon oxide, or an organic insulating material having a low dielectric constant, such as an acryl group organic compound, Teflon, BCB, cytop, or PFCB.

Figure 4H:
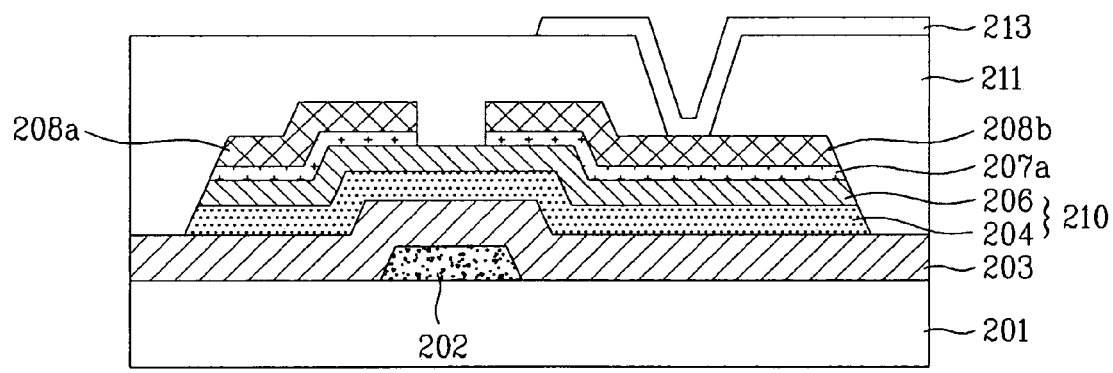

Referring to FIG. 4H, a transparent metal film is deposited on an entire surface of the insulating substrate 201 including the contact hole 212, and subjected to photo and etching processes with a fourth mask to remove the transparent metal film selectively, to form a pixel electrode 213 electrically connected to the drain electrode 208b through the contact hole 212.

As has been described, the flat display device and the method for fabricating the same of the present invention has the following advantages.

First, the reduction of the steps of a process in fabrication of an array substrate with an active layer of µc-Si crystallized by a UV laser beam permits to simplify the process and reduce cost.

Second, the formation of a thick active layer of a stack of a polysilicon layer and an overlying amorphous silicon layer, which improves mobility, permits to improve a device performance.

Third, a high performance panel can be fabricated at a low cost when the present invention is applied to an AMOLED, and a super high definition product can be fabricated if the present invention is applied to an LCD.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for forming an array substrate for a display device comprising the steps of:
    forming a gate electrode on an insulating substrate;
    forming a gate insulating film on an entire surface of the insulating substrate including the gate electrode;
    forming an amorphous silicon layer and a refractory metal layer on the gate insulating film in succession;
    directing a laser beam to an entire surface of the refractory metal layer to crystallize the amorphous silicon layer into a polysilicon layer;
    removing the refractory metal layer and forming an ohmic contact layer and a metal film in succession;
    forming a source electrode, a drain electrode, and an active layer by removing the metal film, the ohmic contact layer, and the polysilicon layer selectively at the same time;
    forming an interlayer insulating film on an entire surface of the insulating substrate;
    removing the interlayer insulating film selectively to expose a predetermined portion of the surface of the drain electrode, to form a contact hole; and
    forming a pixel electrode electrically connected to the drain electrode through the contact hole.

2. The method as claimed in claim 1, wherein the step of forming a source electrode, a drain electrode, and an active layer includes the steps of;
    applying photoresist to the metal layer, and subjecting the photoresist to refraction, exposure and development, to form a photoresist pattern having thicknesses different from one another,
    removing the metal film, the ohmic contact layer, and the polysilicon layer selectively with a photoresist pattern used as a mask,
    ashing the photoresist pattern to remove a thin portion of the photoresist pattern selectively, and
    selectively removing the metal film with the photoresist pattern ashed thus used as a mask.

3. The method as claimed in claim 1, wherein the refractory metal layer is removed by wet etching.

4. The method as claimed in claim 1, wherein the refractory metal layer is removed by dry etching.

5. The method as claimed in claim 1, wherein the refractory metal layer is removed by dry etching finally after the refractory metal layer is removed by wet etching.

6. The method as claimed in claim 1, wherein the refractory metal layer is removed by wet etching finally after the refractory metal layer is removed by dry etching.

7. The method as claimed in claim 1, wherein the refractory metal layer is formed of one selected from an inorganic insulating material, such as silicon nitride and silicon oxide, and an organic insulating material, such as an acryl group organic compound, Teflon, BCB, cytop, and PFCB.

8. A method for forming an array substrate for a display device comprising the steps of:
    forming a gate electrode on an insulating substrate;
    forming a gate insulating film on an entire surface of the insulating substrate including the gate electrode;
    forming a first amorphous silicon layer and a refractory metal layer on the gate insulating film in succession;
    directing a laser beam to an entire surface of the refractory metal layer to crystallize the first amorphous silicon layer into a polysilicon layer;
    removing the refractory metal layer and forming a second amorphous silicon layer, an ohmic contact layer and a metal film in succession;
    forming a source electrode, a drain electrode, and an active layer by removing the metal film, the ohmic contact layer, the polysilicon layer and the second amorphous silicon layer selectively at the same time;
    forming an interlayer insulating film on an entire surface of the insulating substrate;
    removing the interlayer insulating film selectively to expose a predetermined portion of the surface of the drain electrode, to form a contact hole; and
    forming a pixel electrode electrically connected to the drain electrode through the contact hole.

9. The method as claimed in claim 8, wherein the refractory metal layer is removed by wet etching.

10. The method as claimed in claim 8, wherein the refractory metal layer is removed by dry etching.

11. The method as claimed in claim 8, wherein the refractory metal layer is removed by dry etching finally after the refractory metal layer is removed by wet etching.

12. The method as claimed in claim 8, wherein the refractory metal layer is removed by wet etching finally after the refractory metal layer is removed by dry etching.

13. The method as claimed in claim 8, wherein the first amorphous silicon layer is crystallized by directing a UV laser beam to an entire surface of the refractory metal.

14. The method as claimed in claim 8, wherein the refractory metal layer is formed of one selected from an inorganic insulating material, such as silicon nitride and silicon oxide, and an organic insulating material, such as an acryl group organic compound, Teflon, BCB, cytop, and PFCB.

* * * * *